United States Patent
Yamaguchi et al.

(10) Patent No.: US 10,672,119 B2
(45) Date of Patent: Jun. 2, 2020

(54) INSPECTION DEVICE

(71) Applicant: HITACHI HIGH-TECH CORPORATION, Minato-ku, Tokyo (JP)

(72) Inventors: Atsuko Yamaguchi, Tokyo (JP); Masami Ikota, Tokyo (JP); Kazuhisa Hasumi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 123 days.

(21) Appl. No.: 15/758,630

(22) PCT Filed: Sep. 10, 2015

(86) PCT No.: PCT/JP2015/075720
§ 371 (c)(1),
(2) Date: Mar. 8, 2018

(87) PCT Pub. No.: WO2017/042932
PCT Pub. Date: Mar. 16, 2017

(65) Prior Publication Data
US 2018/0308228 A1    Oct. 25, 2018

(51) Int. Cl.
*G06K 9/00* (2006.01)
*G06K 9/48* (2006.01)
(Continued)

(52) U.S. Cl.
CPC ....... *G06T 7/001* (2013.01); *G01N 21/95692* (2013.01); *G01N 23/2251* (2013.01);
(Continued)

(58) Field of Classification Search
USPC ............................ 382/199, 149; 348/126, 92
See application file for complete search history.

(56) References Cited

U.S. PATENT DOCUMENTS 5,729,622 A * 3/1998 Csipkes ............... G02B 6/3807
356/73.1
5,825,913 A * 10/1998 Rostami ................... G06T 7/73
382/151
(Continued)

FOREIGN PATENT DOCUMENTS

JP          09/311020        12/1997
JP       2003-031469 A       1/2003
(Continued)

OTHER PUBLICATIONS

Japanese Office Action dated Oct. 30, 2018 for Application No. 2017-538794.

(Continued)

*Primary Examiner* — Kathleen Y Dulaney
(74) *Attorney, Agent, or Firm* — Miles & Stockbridge, P.C.

(57) ABSTRACT

In order to provide an inspection device capable of quantitatively evaluating a pattern related to a state of a manufacturing process or performance of an element, it is assumed that an inspection device includes an image analyzing unit that analyzes a top-down image of a sample in which columnar patterns are formed at a regular interval, in which an image analyzing unit 240 includes a calculation unit 243 that obtains a major axis, a minor axis, an eccentricity, and an angle formed by a major axis direction with an image horizontal axis direction of the approximated ellipse as a first index and a Cr calculation unit 248 that obtains a circumferential length of an outline of a columnar pattern on the sample and a value obtained by dividing a square of the circumferential length by a value obtained by multiplying an area surrounded by the outline and $4\pi$ as a second index.

10 Claims, 8 Drawing Sheets

(51) Int. Cl.
| | |
|---|---|
| H04N 7/18 | (2006.01) |
| G06T 7/00 | (2017.01) |
| G01N 23/2251 | (2018.01) |
| H01L 21/67 | (2006.01) |
| G03F 1/44 | (2012.01) |
| G01N 21/956 | (2006.01) |
| G03F 7/20 | (2006.01) |
| G06T 7/64 | (2017.01) |
| H01L 21/66 | (2006.01) |

(52) U.S. Cl.
CPC ............ *G03F 1/44* (2013.01); *G03F 7/70625* (2013.01); *G06T 7/0004* (2013.01); *G06T 7/64* (2017.01); *H01L 21/67288* (2013.01); *G06T 2207/10061* (2013.01); *G06T 2207/30148* (2013.01); *H01L 22/12* (2013.01)

(56) References Cited

U.S. PATENT DOCUMENTS

| | | | | |
|---|---|---|---|---|
| 5,926,557 | A * | 7/1999 | King | G01N 21/8806 382/149 |
| 8,269,830 | B1 * | 9/2012 | Delaney | G01N 21/95684 348/126 |
| 2004/0081350 | A1 * | 4/2004 | Kitamura | G06K 9/00 382/149 |
| 2005/0002552 | A1 * | 1/2005 | Dunn | G01N 15/1475 382/133 |
| 2005/0025357 | A1 * | 2/2005 | Landwehr | A01M 1/026 382/170 |
| 2006/0127881 | A1 * | 6/2006 | Wong | G06K 9/00127 435/4 |
| 2009/0034829 | A1 * | 2/2009 | Hamada | G01N 21/94 382/144 |
| 2009/0114816 | A1 | 5/2009 | Tam et al. | |
| 2013/0002853 | A1 * | 1/2013 | Okuyama | A24C 5/3412 348/92 |
| 2013/0121543 | A1 * | 5/2013 | Yu | G06T 7/0012 382/128 |
| 2015/0352376 | A1 * | 12/2015 | Wiggers | A61B 6/545 250/252.1 |
| 2016/0063690 | A1 * | 3/2016 | Ushiba | G01N 21/956 382/145 |
| 2016/0320182 | A1 * | 11/2016 | Yamaguchi | G01B 15/00 |

FOREIGN PATENT DOCUMENTS

| | | |
|---|---|---|
| JP | 2007-520697 A | 7/2007 |
| WO | 2015/098350 A1 | 7/2015 |

OTHER PUBLICATIONS

International Search Report of International Application No. PCT/JP2015/075720, dated Nov. 10, 2015.

* cited by examiner

[Fig. 1](a)     [Fig. 1](b)     [Fig. 1](c)
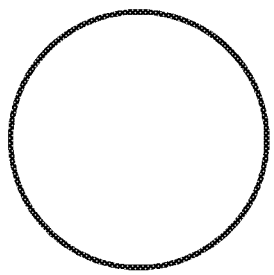 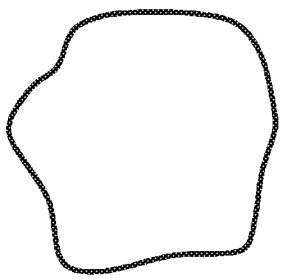 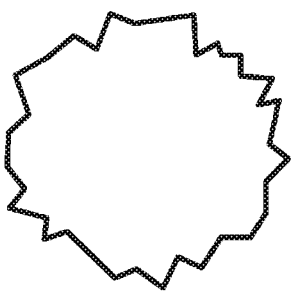
[Fig. 2A]
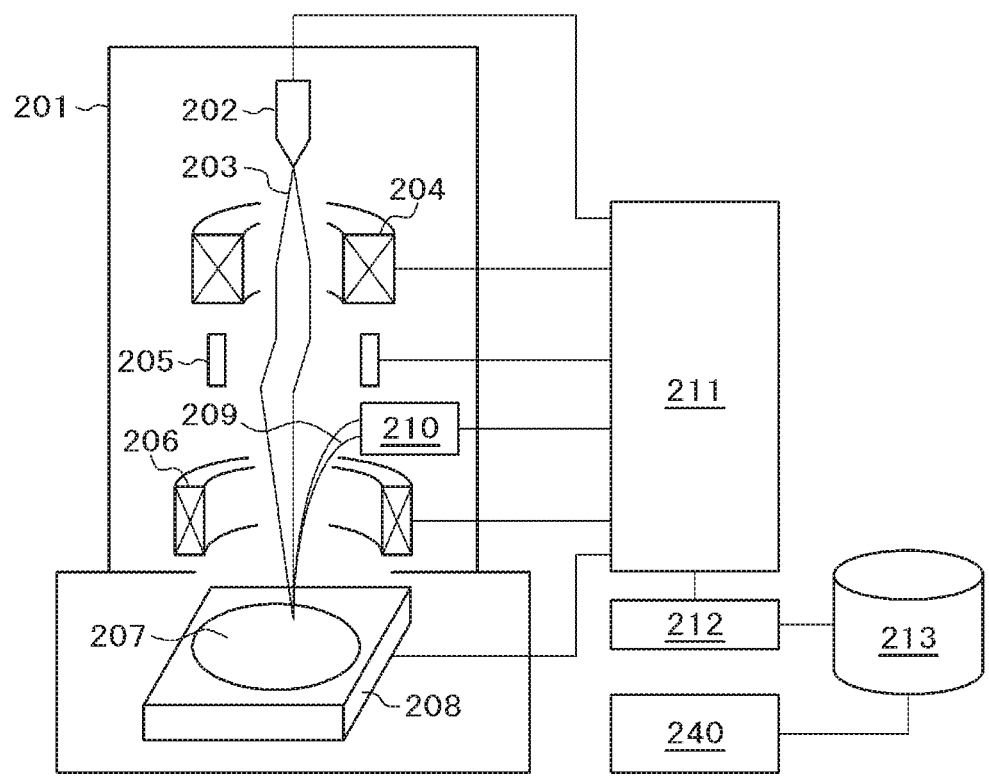

[Fig. 2B]
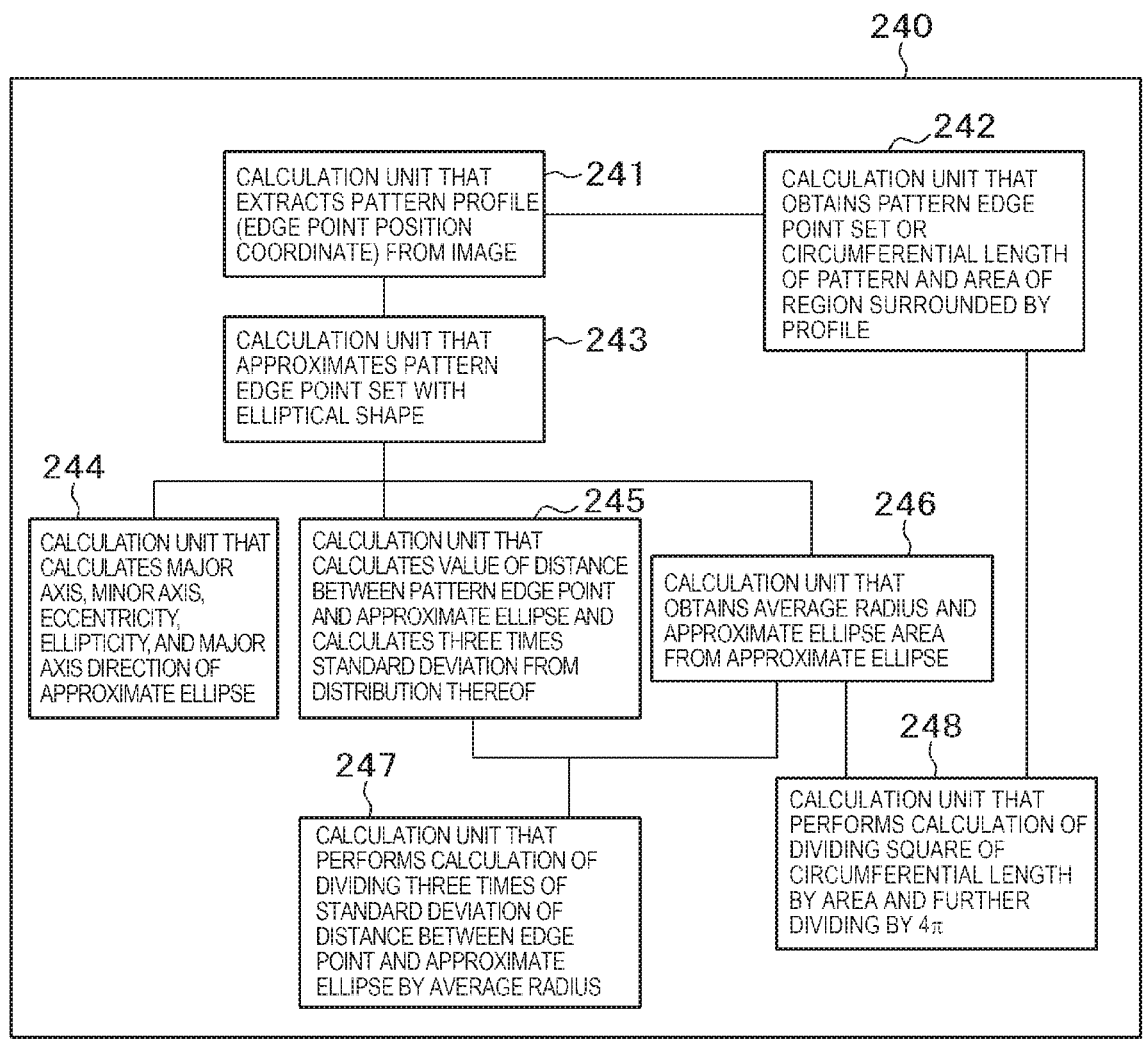

[Fig. 2C]
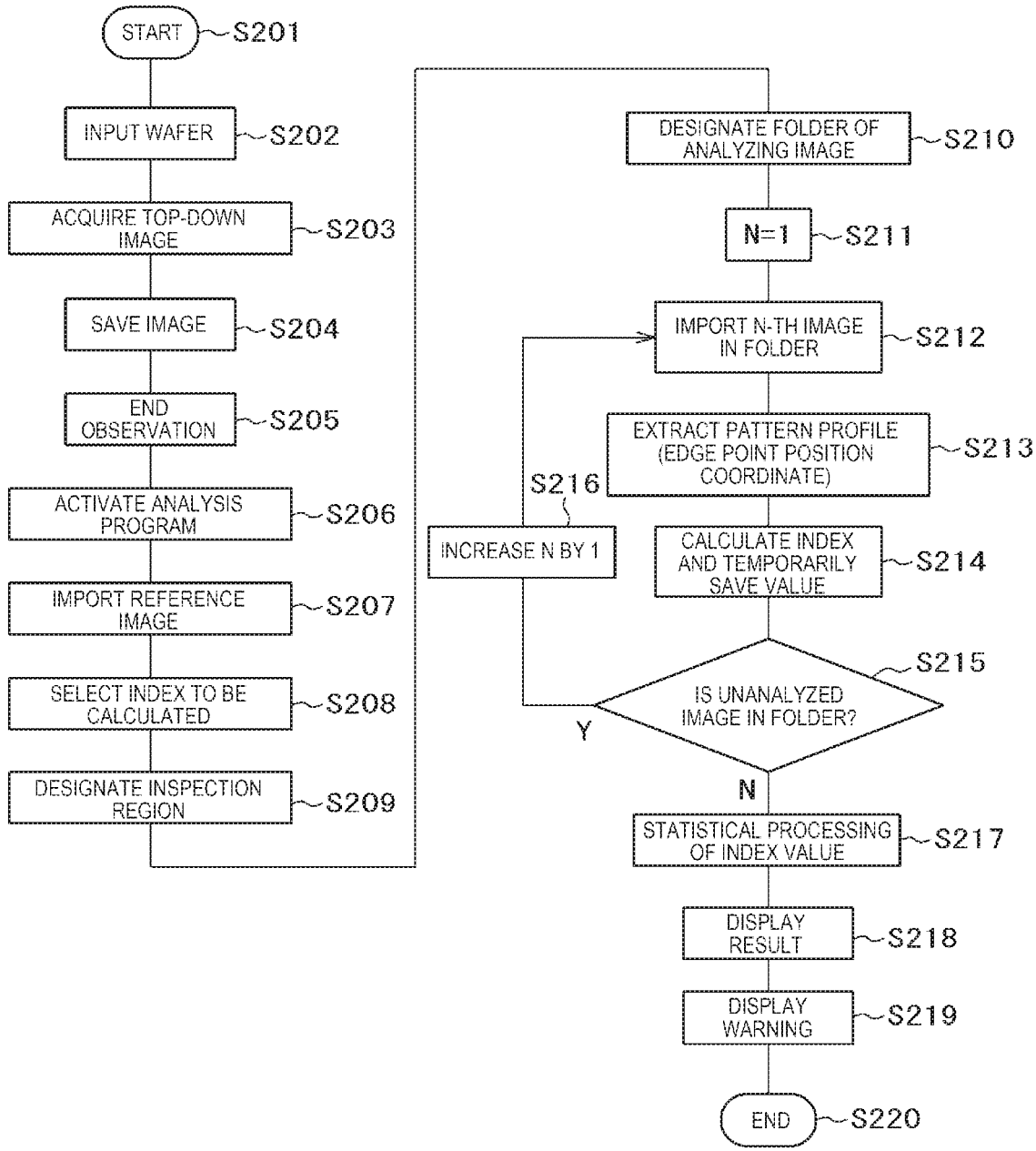

[Fig. 3] (a)
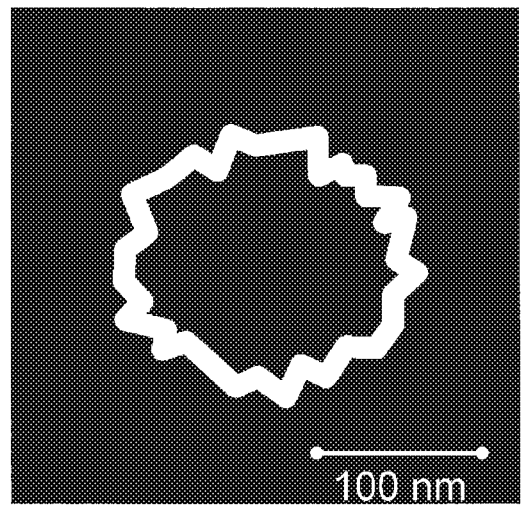
[Fig. 3] (b)
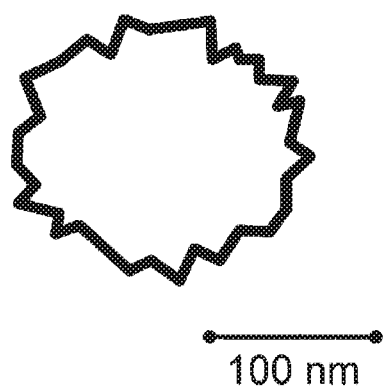

[Fig. 4] (a)
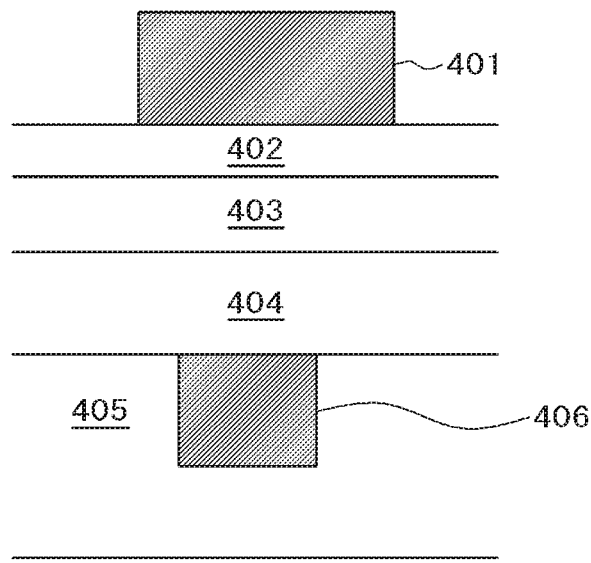
[Fig. 4] (b)
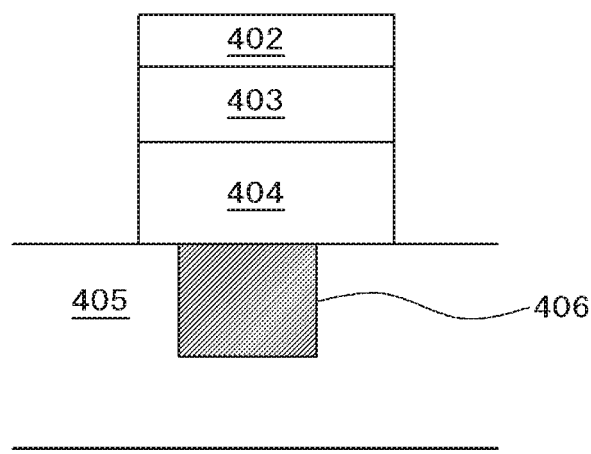

[Fig. 5]
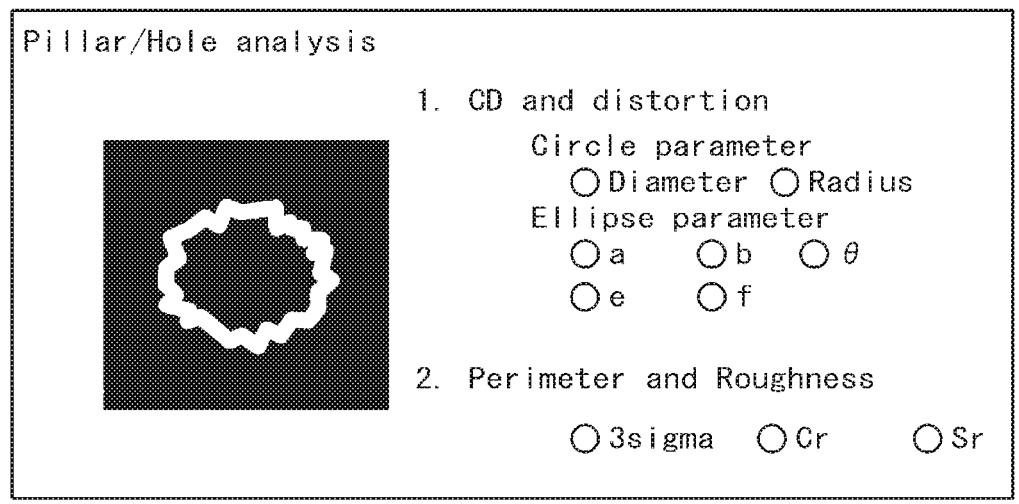
[Fig. 6]
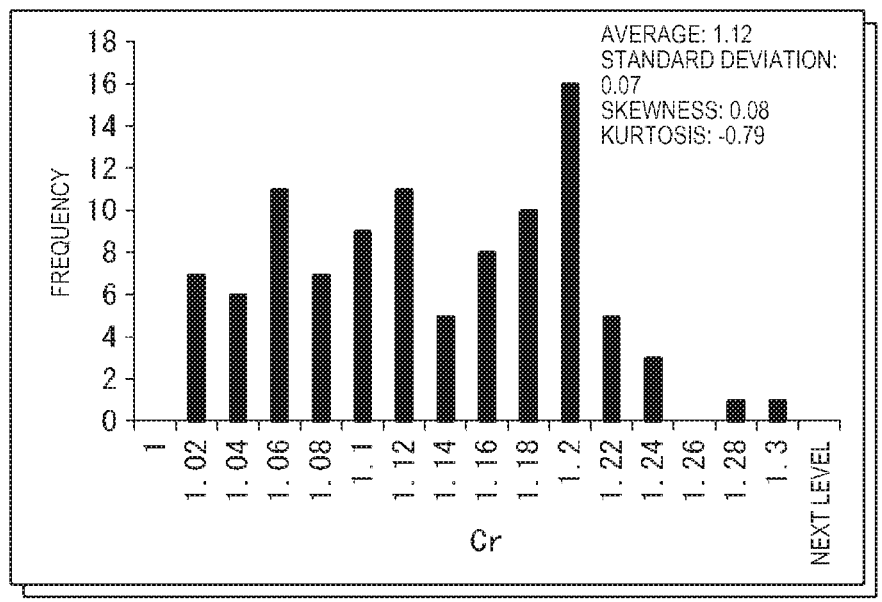

[Fig. 7]
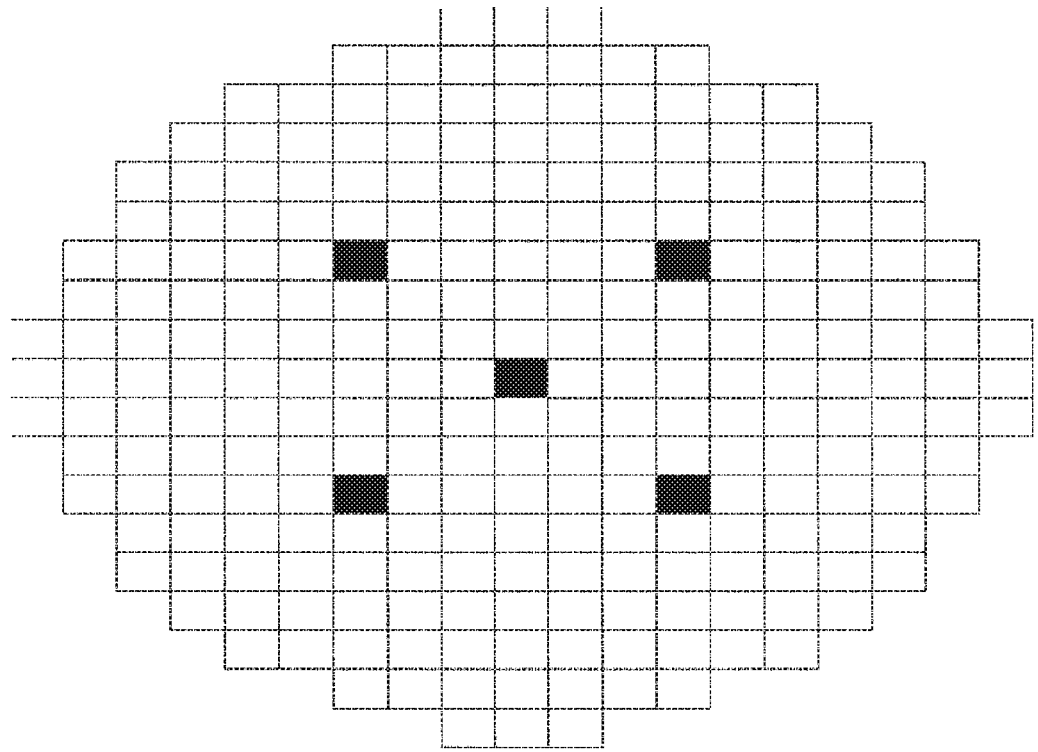
[Fig. 8]
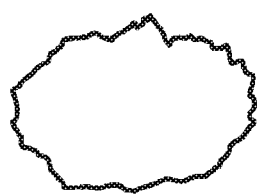 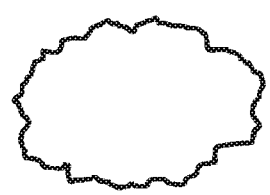
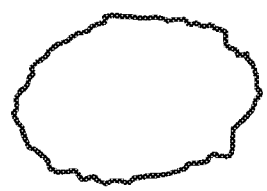 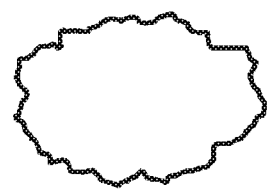

[Fig. 9]
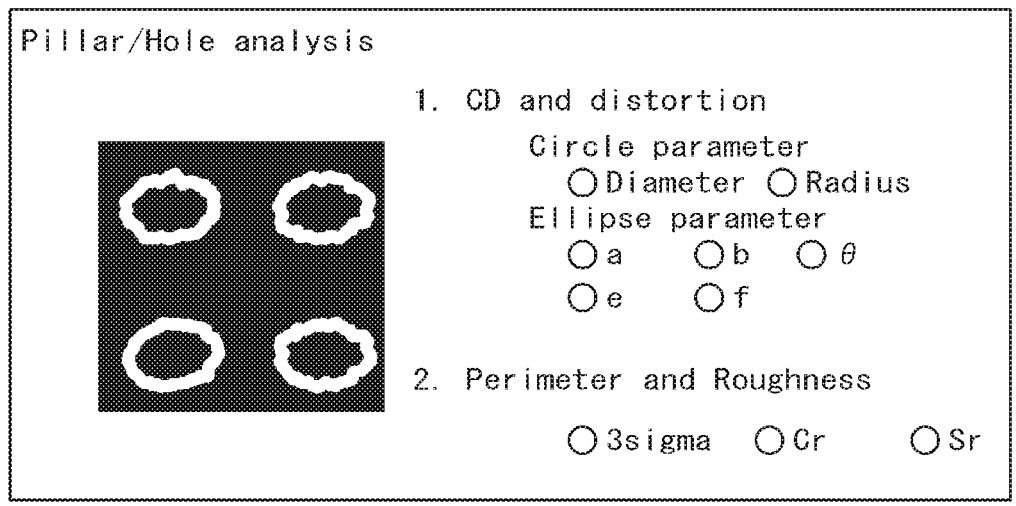
[Fig. 10]
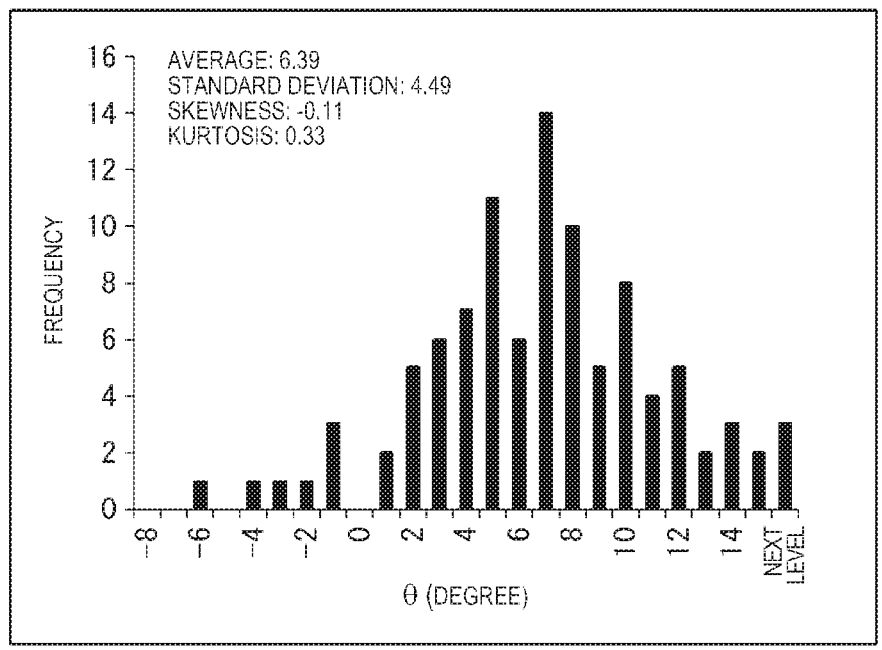

INSPECTION DEVICE

TECHNICAL FIELD

The present invention relates to an inspection device.

BACKGROUND ART

A semiconductor device continues to be downsized, and in recent years, a semiconductor device having a new structure emerges. Among them, in a memory device using a resistive element and a magnetic element, there is a device that has a non-conventional shape, forms a pillar structure having a diameter of several tens of nanometers or less and stores data in the pillar structure. In addition, also in a logic device, a structure in which a gate is formed around a channel region of a columnar structure is proposed. Hereinafter, this columnar shape is referred to as nanopillar. Some nanopillars have a small aspect ratio, and the nanopillars should be referred to as nanodots in some cases. However, here, the nanopillars are collectively referred to as a nanopillar.

In addition to the semiconductors, in medical use, a device which is formed with nanopillar shapes concentrated in an inspection of cells, blood, or the like may be used in some cases.

In general, top-down observation using a critical dimension scanning electron microscope (hereinafter referred to as CD-SEM) having a length measurement function is introduced for inspection of such a fine pattern. In a case of a semiconductor device, a pattern formed on a Si substrate is observed. In addition, in a case of inexpensive chips such as a chip for medical use, a mold is an object of observation. The reason why the CD-SEM is used is a high magnification of the apparatus and high measurement reproducibility. In mass production plants, it is necessary to automatically adjust a state of the hardware, automate an imaging, and automate processing and output of a result. However, the CD-SEM and surrounding software of the CD-SEM are evolutionally advanced and are responded to these demands.

Not only a critical dimension (hereinafter, referred to as "CD") but also a slight deviation from design data of a pattern shape has become a problem as the pattern dimension is reduced. Therefore, an index to evaluate an overcome of the pattern shown in an image is proposed, and the function of the CD-SEM is increasing. For example, a fine irregularity of an edge of a line pattern is called line edge roughness, and its measurement function is general.

In also the evaluation of the overcome of the nanopillars, a matter that an image analyzing is performed by performing top-down observation is considered as a method most easy to introduce in the mass production process.

Therefore, a method to evaluate the shape from a top-down observation image of the nanopillar is required.

There are no shape evaluation methods specialized for the nanopillars so far. However, as a method for evaluating the shape of a hole pattern of a semiconductor, PTL 1 and PTL 2 show examples of various indices. A two-dimensional closed curve obtained by top-down imaging of a pattern is approximated by an ellipse, a feature amount such as a major axis direction thereof, a circumferential length of a closed curve or a value obtained by dividing the circumferential length by an area, and an eccentricity of an ellipse is output. In this example, there is an object to detect an abnormality of a pattern forming apparatus (exposure apparatus), and an index which easily detects a distortion in a certain direction and a focus deviation of a transferred image easily caused by an optical lens or the like is described.

CITATION LIST

Patent Literature

PTL 1: JP-A-2003-031469
PTL 2: JP-T-2007-520697

SUMMARY OF INVENTION

Technical Problem

When considering a shape evaluation of a device such as a chip for a semiconductor or a chip for medical use, firstly, indices greatly related to the performance are required. In addition, even if a good and a defect of each pattern is known, since it is not ordinary to commercialize only a product having a good item pattern without commercializing a defective product, it is important to quantify statistical behaviors in the mass production process.

From such a viewpoint, the inventors reviewed a shape management method in a conventional evaluation method. The inventors performed examination by considering that the following three types of shape evaluations are important in shape management.

Firstly, in order to prevent resistance increase in wiring between memory elements (resistance element and magnetic element) and an upper layer and a lower layer of the memory device, there is a shape evaluation for recognizing a distortion direction of an elliptical shape and a distortion amount. When an area of a portion in contact with the upper layer or the lower layer decreases since a pattern is extremely distorted, since the resistance becomes large, it is necessary to evaluate the resistance. In order to solve the problem, it is effective to apply a length of the major axis of the ellipse and the direction of the major axis when a two-dimensional closed curve is approximated by an ellipse shown in PTL 1, and an eccentricity of the ellipse shown in Patent Document 2 (although it is an index of a hole pattern having a concave figure) to the nanopillar of a memory element (having a convex figure). Since the wiring is also applied to the lower end and the upper end of the pillar, the same also applies in the case of the nanopillar used in the logic device.

Secondly, in both semiconductor devices of memory and logic, pillar sides are exposed to plasma during processing, and the shape evaluation is performed to recognize a degree of the deterioration. Here, among a volume of the pillar, it can be considered that an amount proportional to the circumferential length is deteriorated due to damage. For example, it is assumed that the top-down image of the pillar has a shape as illustrated in FIGS. 1(a) and 1(b). The areas of these two closed curves are the same. However, the pillar corresponding to FIG. 1(b) is more affected by damage. The circumferential length of the two-dimensional closed curve shown in PTL 1 is also effective as a parameter for predicting element performance. In addition to this, the amount of deviation from a circle of an actually measured outline shape which is called hole edge roughness or contact hole edge roughness (PTL 2) is also effective. It is considered that the performance varies depending on the area where the pillar contacts with cells and blood, the same also applies to the nanopillar for medical use or the like.

Thirdly, there is a shape evaluation to recognize the shape deterioration related to the dimensions of the finally formed element. In a resist pattern, there is not a final device, in a case where there are two patterns of FIGS. 1(b) and 1(c) of the same degree as the deviation amount from the circle called the hole edge roughness or the contact hole edge roughness described above (PTL 2), since the region of FIG. 1(c) is exposed to plasma during etching is greater than that of FIG. 1(b), the pattern dimension becomes reduced after etching. In addition, since an etching rate is not stabilized in a portion having fine irregularities, there is a problem in that the pattern size varies. Similar to the second case, this phenomenon is considered to be highly likely to be detected by using the circumferential length.

However, a conventional technology is not sufficient as a line management tool in a manufacturing factory of an element having a nanopillar structure, and it was found that there are the following three problems. The first is that the indices shown in PTL 1 are not standardized. In a case where numerical values are given for a plurality of shapes, comparison can be performed. However, it is not possible to intuitively understand an absolute value of the shape deterioration. In addition, a case where target dimensions are different from each other, it is impossible to compare a degree of deterioration of the shape. The second is that these conventional indices assume wafer pass and fail determination or feedback to a pattern forming device (such as an exposure apparatus) in all cases, and basically there is an object of a resistance management between wirings. On the other hand, what is required in the future is an inspection device that can select an appropriate index depending on the purpose. That is, it is necessary to make it easy to selectively use the shape deterioration leading to a positional shift, the shape deterioration directly leading to the damage on the element, and the shape deterioration finally leading to the element dimension. The third is that the management of a mass production site is not assumed. In a set of numerical values of simple indices, the management that the operator determines is possible, but implementation in automatic process is impossible. It is necessary to further process the above indices.

An object of the present invention is to provide an inspection device capable of quantitatively evaluating a pattern related to a state of a manufacturing process or a performance of an element in view of the above problems. In addition, another object of the present invention is to provide an inspection device capable of easily executing automatic process management at a manufacturing site.

Solution to Problem

As an embodiment for achieving the above objects, there is provided an inspection device including an image analyzing unit that analyzes a top-down image signal of a sample which is output from a charged particle beam apparatus and has a plurality of columnar (pillar) or hole-shaped (hole) patterns formed at a regular interval, in which the image analyzing unit includes an edge calculation unit that calculates an outline of an image obtained from the top-down image signal as a set of discrete points representing a position of a boundary (edge), an approximation calculation unit that approximates the set of the points of the edge by an ellipse or a circle, a distance calculation unit that calculates a distance between the approximated ellipse or the circle and each point of the edge, an angle calculation unit that calculates a major axis, a minor axis, an eccentricity, and an angle formed by a major axis direction with an image horizontal axis direction of the approximated ellipse as a first index group, and a Cr calculation unit that calculates a circumferential length of the outline of the columnar pattern or the hole-shaped pattern on the sample and a value obtained by dividing a square of the circumferential length by a value obtained by multiplying an area surrounded by the outline and 4π as one of a second index group.

In addition, in the inspection device, the image analyzing unit further includes a frequency distribution calculation unit that calculates a frequency distribution of index values of the first and second index groups calculated on an image of a plurality of patterns obtained from a plurality of locations on the sample, a statistical index calculation unit that calculates an average value of the index values, a standard deviation of the distribution, skewness, and kurtosis from the calculated frequency distribution as a statistical index group, and warning means for issuing a warning in a case where the calculated index value in the statistical index group deviates from an upper limit value or a lower limit value input in advance for at least one of the statistical index groups or both range of the upper limit value and the lower limit value.

In addition, there is a provided an inspection device including a charged particle beam irradiation unit that irradiates a sample with a charged particle beam, a control unit that controls the charged particle beam irradiation unit, an image analyzing unit that analyzes an image obtained by using a secondary electron emitted from the sample by the irradiation of the charged particle beam, and a terminal that includes a display unit connected to the control unit and the image analyzing unit, in which wherein a plurality of columnar patterns or hole-shaped patterns are formed on a surface of the sample, and the image analyzing unit includes first selection means for selecting a first index among a diameter D and a radius R of an approximate circle for approximating a shape of the columnar pattern or the hole-shaped pattern when subjected to a top-down observation by a circle, and a major axis a, a minor axis b, an angle θ formed by an major axis direction with an image horizontal axis direction, an eccentricity e, and an ellipticity f of an approximate ellipse for approximating a shape of the columnar pattern or the hole-shaped pattern with an ellipse, as the first index for analyzing the columnar pattern or the hole-shaped pattern, and second selection means for selecting a second index among Cr that is a value obtained by dividing a square of a circumferential length of an outline of the columnar pattern or the hole-shaped pattern obtained from the image by 4π and further dividing the value by an area surrounded by the outline and Sr that is a value obtained by dividing a value, which is obtained by multiplying a standard deviation of a distribution of values of a distance between the approximate ellipse or the approximate circle and the edge of the outline by 3, by a radius of the approximate circle or an average radius of the approximate ellipse.

In addition, there is provided an inspection device including a charged particle beam irradiation unit that irradiates a sample with a charged particle beam, a control unit that controls the charged particle beam irradiation unit, an image analyzing unit that analyzes an image obtained by using a secondary electron emitted from the sample by the irradiation of the charged particle beam, and a terminal that includes a display unit connected to the control unit and the image analyzing unit, in which a plurality of columnar patterns or hole-shaped patterns are formed on a surface of the sample, and the display unit of the terminal displays a screen for selecting a diameter D and a radius R of an approximate circle for approximating a shape of the columnar pattern or the hole-shaped pattern when subjected to a top-down observation by a circle, and a major axis a, a minor axis b, an angle θ formed by an major axis direction with an image horizontal axis direction, an eccentricity e, and an ellipticity f of an approximate ellipse for approximating a shape of the columnar pattern or the hole-shaped pattern with an ellipse, as a first index for analyzing the columnar pattern or the hole-shaped pattern, and Cr that is a value obtained by dividing a square of a circumferential length of an outline of the columnar pattern or the hole-shaped pattern obtained from the image by $4\pi$ and further dividing the value by an area surrounded by the outline and Sr that is a value obtained by dividing a value, which is obtained by multiplying a standard deviation of a distribution of values of a distance between the approximate ellipse or the approximate circle and the edge of the outline by 3, by a radius of the approximate circle or an average radius of the approximate ellipse, as a second index.

Advantageous Effects of Invention

According to the present invention, an inspection device capable of quantitatively evaluating a pattern related to a state of a manufacturing process or a performance of an element can be provided. In addition, an inspection device capable of easily executing automatic process management at a manufacturing site can be provided.

BRIEF DESCRIPTION OF DRAWINGS

FIGS. 1(a) to 1(c) are schematic views of a profile of a pattern extracted from an image (same area) obtained by top-down observation of a nanopillar, FIG. 1(a) illustrates an example of a normal pattern, FIG. 1(b) illustrates an example of a pattern with distortion in shape, FIG. 1(c) illustrates an example of a pattern in which an amount of deviation from a perfect circle called hole edge roughness is the same as in FIG. 1(b), but the cycle has small roughness and the circumferential length is longer than that of FIG. 1(b).

FIG. 2A is a conceptual diagram illustrating an example of a configuration of an inspection device according to a first example of the present invention.

FIG. 2B is a conceptual diagram illustrating an example of a configuration of an image analysis apparatus in the inspection device illustrated in FIG. 2A.

FIG. 2C is a flowchart illustrating an example of an inspection process in the inspection device illustrated in FIG. 2A.

FIGS. 3(a) and 3(b) are schematic views of an image obtained by top-down observation of a nanopillar sample using the inspection device illustrated in FIG. 2A, and FIG. 3(b) is a schematic view of a pattern profile extracted from the image illustrated in FIG. 3(a).

FIGS. 4(a) and 4(b) are schematic views illustrating an example of a cross-sectional structure of an observation sample, and FIG. 4(b) is a schematic view illustrating a cross-sectional structure after etching the sample illustrated in FIG. 4(a).

FIG. 5 is a schematic view illustrating an example of an index selection screen displayed on a terminal (monitor screen) of the inspection device illustrated in FIG. 2A.

FIG. 6 is a schematic view illustrating an example of an analyzing result displayed on the terminal (monitor screen) of the inspection device illustrated in FIG. 2A.

FIG. 7 is a plan view illustrating a position of a chip on a wafer observed by an inspection device according to a second example of the present invention.

FIG. 8 is a plan view illustrating an example of a pattern outline obtained in an inspection device according to a third example of the present invention.

FIG. 9 is a schematic view illustrating an example of an index selection screen displayed on a terminal (monitor screen) of the inspection device according to the third example of the present invention.

FIG. 10 is a schematic view illustrating an example of an analyzing result displayed on the terminal (monitor screen) of the inspection device according to the third example of the present invention.

DESCRIPTION OF EMBODIMENTS

In order to achieve the above objects, the inventors decided to introduce the following shape indices. That is, the following new dimensionless amounts Cr and Sr are added to a major axis, a minor axis, an angle θ formed by a major axis direction and an image horizontal axis direction, a circumferential length, hole edge roughness, eccentricity, and ellipticity of the approximate ellipse described in PTL 1 and PTL 2.

[Expression 1]

$$Cr = C^2/4\pi S \qquad (1)$$

[Expression 2]

$$Sr = 3\mathrm{sigma}/r \qquad (2)$$

Here, C is a circumferential length of a pattern obtained from a profile of a pattern expressed as a set of discrete points, S is an area surrounded by the profile, sigma shown in PTL 2 is a standard deviation corresponding to an amount of deviation from a reference figure (circle or ellipse) of a pattern edge position, and r is a radius of an approximate circle of a case of approximating the pattern profile by a circle. Cr is normalized to be 1 in the case of a perfect circle by dividing by $4\pi$. That is, depending on how large this value is from 1, it is possible to indicate how large the damage to the outer circumference is compared with the regional area in a closed curve irrespective of the radius and diameter. In addition, in pillar-shaped memory devices, the influence of irregularities appearing on the outer periphery becomes more serious as a storage region volume (the area in the top view) of the expected device is smaller. Therefore, there is also a merit that the index obtained by dividing these by the average radius directly connected to the area or the area rather than the simple circumferential length (C in Expression (1)) and the standard deviation of irregularities (sigma in Expression (2)) has high correlation with device performance. Both Cr and Sr are dimensionless amounts.

In the case of a perfect circle, although the same effect is expected for both of the above two indices, it easily recognizes the standardized Cr. In addition, Cr has higher sensitivity to detect high frequency roughness which greatly affects the pattern after etching. On the other hand, in a case where a design pattern is an ellipse, since Cr becomes a value deviated from 1 even if the pattern is as designed, it is preferable to use Sr rather than Cr.

Furthermore, the average value, the standard deviation, the skewness, and the kurtosis of the distribution of the value of the shape index described above are used as process control indices. The shape index to be used which is selected from the above-described shape indices is represented by ρ. Mρ values obtained from M patterns are defined as $\rho\_1, \rho\_2, \ldots,$ and $\rho\_M$. The skewness and the kurtosis are commonly used in statistics, and are represented by the following equation in order.

[Expression 3]
$$\gamma_1 = \frac{1}{M \cdot \sigma^3} \sum_{i=1}^{M} (\rho\_i - \mu)^3 \qquad (3)$$

[Expression 4]
$$\gamma_2 = \frac{1}{M \cdot \sigma^4} \sum_{i=1}^{M} (\rho\_i - \mu)^4 \qquad (4)$$

Here, $\mu$ is the average value of the distributions of $\rho$, and $\sigma$ is the standard deviation of the distribution of $\rho$ (it is different from sigma of hole edge roughness).

As an inspection procedure, a pattern profile is first extracted from a CD-SEM image including a pattern to be a closed curve shape such as a dot, a pillar, or a hole, and a two-dimensional closed curve which is the profile is made as a data as a set of a plurality of discrete edge points. Next, the set of edge points is approximated by a reference figure. The types of the above-described reference figures are the ellipse, the perfect circle, a smooth shape drawn with four corners of a square or a rectangle, and a predicted figure obtained by simulation of pattern formation. Thereafter, an index relating to the shape is calculated.

The index to be used can be selected depending on the purpose. For example, it is possible to select indices suitable for each of a case of detecting shape distortion leading to an abnormality in the wiring resistance with the upper layer and the lower layer, a case of detecting a failure in performance of a magnetic device or a memory device using a resistive element, or a case where it is desired to predict the abnormality in the final pattern dimension, while waiting for the etching process later.

In addition, as a shape index, a value (Expression (1)) obtained by dividing a radius and diameter of the approximate circle in a case of approximating by a circle, a major axis, a minor axis, an angle formed by the major axis with an image horizontal axis direction, eccentricity, ellipticity, pattern circumferential length, and a square of the pattern circumferential length by $4\pi$ and further dividing by the area of the region surrounded by the approximate circle, the approximate ellipse, or the circumference, and a value (Expression (2)) obtained by dividing a standard deviation of a distribution of an amount of deviation of an edge position from an approximate figure of a case where the pattern shape is approximated by the circle or the ellipse, three times of the standard deviation, or the three times of the standard deviation by the radius of the approximate circle are calculated.

Furthermore, by applying the above process to a pattern of a plurality of spots having the same shape in terms of design, calculating the plurality of values of the in indices, and calculating the indices on the design from the plurality of frequency distribution of these results, it is possible to express the performance of complicated figures on a water or lot with a simple index. It is also possible for an operator to determine whether the pattern formation process is good or bad, or compare automatically with a limit value of the index input in advance to issue a warning based on the index.

That is, an overcome of the pattern relating to a state of an exposure apparatus or a product performance to be finished is quantitatively evaluated from the image obtained by observation of a substrate having a dot or pillar shape, and the pattern formation process can be simply managed with high accuracy.

Hereinafter, examples according to the present invention will be described with reference to drawings. The same reference numerals denote the same constituent elements.

Example 1

An inspection device according to a first example of the present invention will be described with reference to FIGS. 1(*a*) to 6. In the present example, an example in which a wafer with a resist pattern after lithography is evaluated by using a new index by using this inspection device and the pattern formation process is managed.

Firstly, the inspection device will be described with reference to FIG. 2A. The present inspection device includes an electron source (electron gun 202), an electron optical system (lens 204, deflector 205, lens 206, or the like) for irradiating a sample 207 placed on a sample stage 208 with electrons emitted from the electron source as an electron beam 203, a detector 210 that detects a secondary electrons 209 emitted from the sample 207 by radiation of the electron beam 203, a control system 211 for controlling them, a terminal (including a monitor screen) 212 of an inspection device that displays image data of a surface of the sample obtained based on a signal of the secondary electrons detected by the detector 210 (hereinafter, simply referred to as the terminal 212, the terminal 212 of the control system and the image analysis apparatus, or the terminal 212 of the image analysis apparatus), a data storage device 213 that saves various types of data items, and an image analysis apparatus 240 that performs analyzing of a signal of the secondary electron or the like. Reference numeral 201 denotes a housing of a scanning electron microscope. Although an example of pattern observation using the electron beam will be described in this example, ion beams can be used as well as electron beams.

In the sample 207, fine patterns in the shape of a plurality of columns are arranged at regular intervals on the substrate. The column shape of this sample is called nanopillar. This pattern is a perfect circle in terms of the design.

The image is obtained as a result of irradiating the sample 207 with the electron beam 203 in a direction perpendicular to the substrate. In the image, the signal intensity at the edge portion of the irregularities on the sample is high. Therefore, the image obtained by irradiating the nanopillar portion with the electron beam to appears as a circle or a figure close to an ellipse.

As illustrated in FIG. 2B, the image analysis apparatus 240 has a function (edge calculation unit 241) of discretely calculating the position of a boundary (edge) of the pattern from image data displayed on the terminal 212 of the inspection device, in particular, the figure corresponding to a nanopillar group. In addition, the image analysis apparatus 240 has a function (approximation calculation unit 243) of approximating a point group of the edge which is discretely obtained by an ellipse figure and a function (distance calculation unit 245) of calculating a distance between the approximate ellipse and each point of the edge. Furthermore, the image analysis apparatus 240 has a function (angle calculation unit 244) of calculating a first index indicating a pattern distortion relating to wiring performance, that is, a major axis, a minor axis, eccentricity of the approximate ellipse, and an angle θ formed by a major axis direction and the image horizontal axis direction, a function of displaying a side surface area of the nanopillar or a second index leading to the defect in the lateral area of the nanopillar and the pattern dimension after etching, that is, a circumferential length of the two-dimensional closed curve (circumferential length calculation unit 242), a normalized circumferential length and an area ratio (calculated by a Cr calculation unit 248) shown in Expression (1), a hole edge roughness 3 sigma (calculated by a distance calculation unit 245), an average radius (calculated by an calculation unit 246), a normalized hole edge roughness shown in Expression (2) (calculated by an Sr calculation unit 247) for each group and causing an operator to select one from three groups according to the purpose, a function of capable of selecting one or more of indices desired to be calculated from the selected group, or a function of calculating a value of the selected index from the image data (calculation units 242, 245, 246, 247, and 248). Furthermore, the image analysis apparatus 240 has a function of displaying a frequency distribution after obtaining a plurality of index values by applying calculation of the index to the plurality of patterns and calculating the average value of the frequency distributions, a standard deviation, skewness, and kurtosis of the distributions shown in Expressions (3) and (4).

In addition, the image analysis apparatus 240 has a function of inputting a range to become a value with respect to the above-described average value, the standard deviation, the skewness, and the kurtosis (these values can be obtained empirically, for example) in advance and a function of displaying a warning on the device screen in a case where the average value, the standard deviation, the skewness, and the kurtosis obtained as a result of analyzing are not in the range to become a value or outputting a signal to a device for managing a manufacturing process from an output terminal of the device.

A target sample (wafer) is input to the inspection device illustrated in FIG. 2A, and detecting a secondary electron while scanning the electron beam, and thus a top-down image of the pattern to be a target on the wafer is obtained. FIG. 3(*a*) illustrates a schematic view of an example of the image analyzed in this example. The image is obtained by converting the intensity of the electron microscope signal into grayscale, which is expressed by light and shade. However, in here, the particularly light portion is schematically expressed by white and the dark portion is expressed by black. FIG. 3(*b*) illustrates the figure obtained by extracting the profile of the pattern from the image. The profile is a continuous curve, but as data, has a form of a set of discrete edge point positions.

In addition, a schematic view corresponding to a cross-sectional structure of the pattern is illustrated in FIG. 4(*a*). This pattern visible in the top-down image here is a pattern 401, which is formed of a resist material, and in the next process, the pattern is transferred to a layer 402 having a high etching resistance called a hardmask by etching, and further processes an electrode layer 403 which is formed of metal by subsequent etching and a magnetic material layer 404 under the electrode layer 403. The cross-sectional shape after processing is shown in FIG. 4(*b*). A magnetic material layer 404 is located below the magnetic material layer 404, and is connected to a further lower transistor by a wiring pattern 406 which is embedded in an insulating layer 405. In addition, a shape shown in the schematic view of FIG. 3(*a*) is an example, and similar patterns are arranged at a pitch of 500 nm over a wafer of several micron square regions on the chip.

Since a resist pattern 401 is used for an element of a magnetic memory, items which are important in a case of evaluating an overcome are the region (that is not damaged) of the area where the device can effectively exhibit its performance, and is the resistance between the wirings of the lower layer.

The former (area) is simply monitored by the dimension of the resist pattern. The dimension is the diameter calculated by approximating the closed curve by a circle. However, as illustrated in FIGS. 1(*a*) to 1(*c*), there are a case (FIG. 1(*c*)) where even though the diameter of the approximate circle is the same, there are many irregularities of the surroundings and a case (FIG. 1(*b*)) where even though the diameter of the approximate circle is the same, irregularities of the surroundings are small. In this example, in addition to the area of the resist pattern, the dimension of the hardmask pattern after etching is to be reduced and the property of FIG. 1(*c*) which is highly likely to vary must be detected. The shape is suitable as an index of the latter (resistance) is the eccentricity or ellipticity of the pattern.

In this time, as the former index, the conventional pattern edge roughness, that is, the index shown in Expression (1) is used instead of the distribution (standard deviation) of the amount of the deviation from the reference figure of the pattern profile. Here, the reason why Cr is selected instead of Sr is that Cr is more sensitive to high frequency roughness which has a greater influence on the pattern dimension after etching.

The eccentricity is used as the index of the latter. Since the index is easy to understand, it is possible to intuitively recognize the distortion of the shape by using the index.

The executed operation of the user and processing in the device are illustrated in FIG. 2C. First, an image typified by the schematic view of FIG. 3(*a*) is acquired by an inspection device equipped with a scanning electron microscope illustrated in FIG. 2A by the following procedure (S201 to S204). A sample 207 is placed on a sample stage 208 of the scanning electron microscope (S202), the sample 207 is irradiated by an electron optical system including the lenses 204 and 206 and the deflector 205 with the electron beam 203 emitted from the electron gun 202, the secondary electrons 209 generated from the sample are detected by the detector 210 (S203), and image data based on the detection signal is stored in the data storage device 213 via the control system 211 and the terminal (including the monitor screen) 212 of the image analyzing apparatus (S204).

The procedure described above are performed by changing the irradiation position of the electron beam in the region of 5 micron square to obtain a total of 10 pattern images similar to the schematic view of FIG. 3(*a*) (S203). Further, ten chips are selected from the target wafer and the same process are performed for each chip to obtain a total of 100 images (S203). All of these images are stored in the data storage device 213 (S204).

Next, the operator operates the terminal 212 of the image analysis apparatus 240 to operate the program for evaluating the pillar shape (S206). Next, image data as an example is imported from the data storage device 213 (S207) and displayed on the monitor screen of the image analysis apparatus 240. A window (index selection screen) illustrated in FIG. 5 appears on the monitor screen. A part of the displayed window includes a pattern image as illustrated in the schematic view of FIG. 3(*a*). The calculation unit configuring the image analysis apparatus 240 is illustrated in FIG. 2B. A portion for inputting and outputting data to and from or the storage device 213 or the terminal 212 and a portion for instructing a calculation to be performed are abbreviated.

The operator selects the diameter and an eccentricity e as the first index on the monitor screen, clicks the circle at the head of these displays, and selects and registers the index as the index to be calculated. Subsequently, Cr, which is the value obtained by dividing the square of the circumferential length by 4π and further dividing by the area, is selected as the second index, in the same manner (S208). "a" is the major axis of the ellipse, "b" is the minor axis of the ellipse, "θ" is the angle formed by the major axis direction with the image horizontal axis direction, and "f" is the ellipticity.

Next, the operator places an inspection region, that is, a region to be searched for an edge on the displayed image by operating a mouse and clicks an OK button (S209), a measurement result is displayed on the upper right of the image. Furthermore, a storage region name (folder) in which an image (analysis image) desired to be evaluated is stored is designated in another window (S210) and index calculation is executed by programs (S211 to S216). The inspections having the same contents as the inspection performed on the image as the first example (S211) are sequentially performed on the images in the folders (S212 to S216), and the calculated index values are temporarily saved in the image analysis apparatus (S214). Finally, 100 values are obtained from 100 images for one type of index. For this 100 values, histograms are calculated, and statistical indices such as the average value, the standard deviation, the skewness, and the kurtosis are calculated (S217). The statistical index can be calculated by the image analyzing unit.

As a result, the obtained result is displayed on the monitor (S218). The window appears for the number of selected indices, and the frequency distribution of each index and the statistical index are displayed in an overlapping manner. This state is illustrated in FIG. 6. In FIG. 6, the average value, the standard deviation, the skewness, and the kurtosis are displayed as statistical indices, but all of the statistical indices are not always necessary to display. However, all displays are preferable.

In the image analysis apparatus 240, an upper limit value is pre-set for the skewness of the average value of Cr and the distribution of diameters. The former is 1.20 and the latter is 0.60 (values obtained from experience). As a result of this analysis, since the average value of Cr is 1.12, it is passed. The skewness of the diameter distribution is as large as 0.78, and it means that patterns with extremely large diameters are scattered, which means that the distribution trails to the right side (direction with large diameter). Since this value exceeds 0.60, a warning is displayed on the monitor screen (S219), and the process is ended (S220). In addition, although the details of the cause of the pattern in which the pattern dimension becomes extremely large are inspected, it is found that both occurring causes at the edge of the wafer, and it is found that the condition of the exposure apparatus can be adjusted and improved.

By using indices of the Expressions (1), (3), and (4) instead of the conventional roughness index and a simple circumferential length, it is possible to perform the inspection with high correlation with device performance. In addition, until then, it is necessary to change a level to issue a warning for each observation pattern, inducing artificial mistakes. However, the upper limit value of Cr average value 1.20 can be applied directly to other pillar patterns of different sizes and layouts, and the inspection procedure is simple.

In addition, in the related art, it is necessary to reset in order to select an index that is not along with the purpose by mistake, or to send an enormous amount of inspection results including unnecessary indications, which eventually take time to feedback to the process. However, by using this inspection device which can select the index according to the purpose, whether to conduct an inspection focusing on the performance of the memory element or to focus on misalignment with the upper and lower layers, only necessary inspection can be executed more reliably.

Furthermore, determination is quickly performed by monitoring the state of the process by statistical indices (average value, standard deviation, skewness, and kurtosis) on the distribution of indices rather than individual values. In addition, by automatically comparing the calculated statistical index value with the limit value (upper limit value or lower limit value or both the values) of the index input in advance, automation of process management can be easily performed with high accuracy.

By these results, the wafer not suitable for the product can be quickly detected at a lithography stage and can be reworked. In addition, by adjusting the exposure apparatus, it is possible to maintain a yield high for a long period of time.

As described above, according to the present example, it is possible to provide the inspection device that can quantitatively evaluate the pattern related to the state of the manufacturing process or the performance of the element with high accuracy. In addition, it is possible to provide the inspection device that can easily perform automatic process management at the manufacturing site.

Example 2

An inspection device according to a second example of the present invention will be described. In this example, an example in which a wafer with a resist pattern after lithography is evaluated by using a new index and the resist material is evaluated will be described. The items described in Example 1 and not described in this example can also be applied to this example as long as there is no particular circumstance.

The target wafer and the inspection device into which the wafer is input, and the image are the same as in Example 1, the inspection device is same as that illustrated in FIG. 2A, the schematic view of the image is same as that illustrated in FIG. 3(*a*), and the profile of the pattern is the same as that illustrated in FIG. 3(*b*). The image analysis apparatus in this inspection device has a calculation unit that performs a perfect circle approximation in addition to the ellipse approximation. In a case where the calculation unit is used for only the perfect circle approximation, an image analysis apparatus having a calculation unit that performs a perfect circle approximation instead of the ellipse approximation can be obtained.

In the case of material screening, it is preferable to use indices related to both shape distortion and etching resistance. The reason why using the indices is that the one type of index can be quickly determined. Therefore, here, the index Sr shown in Expression (2) is used. The reason why using the index is that the index becomes both indices.

The operator approximates positional coordinate data of the discrete edge point configuring the outline illustrated in FIG. 3(*b*) by a perfect circle using the image analysis apparatus of the inspection device according to the present example (corresponding to a calculation unit 243 in FIG. 2B) in the procedure illustrated in FIG. 2C, calculates a distance between a radius r of the approximate circle (corresponding to a calculation unit 246 in the same drawing) and each edge point from the approximate circle, and calculates a standard deviation sigma of the distribution of the distance among all of the edge points (corresponding to a calculation unit 245 in the same drawing) to obtain an index Sr according to Expression (2) (corresponding to a calculation unit 247 in the same drawing).

Furthermore, the operator captures an image of the pillar located on the right side of the pillar observed on the screen, and similarly, Sr is calculated. This process is repeated to obtain a total of 20 Sr values, and the average value thereof is calculated.

The calculation process of the above-described Sr average value is performed at five chip positions on the wafer, and five Sr average values are obtained. The chip positions are illustrated in FIG. 7. A rectangle drawn by a broken line in FIG. 7 represents an arrangement of the chips. The measurement is performed at black filled chips. The average value of five Sr values is obtained and the obtained value is set as a typical Sr value of the observed wafer. The value is 0.26.

Next, the same analysis as described above is performed on the patterned wafer of the same layout formed with different resists, and the typical Sr value of the wafer is 0.35. Therefore, it is determined that the resist evaluated at the first time gives a good pillar shape, and in the mass production process, it is determined to use the first evaluated resist.

Also in this example, by using Sr instead of conventional sigma or 3 sigma, correlation with device performance is high and inspection can be performed with high accuracy. In addition, the same inspection recipe can be applied to the patterns having different sizes and layouts, and the inspection can be quickly performed.

In addition, similar to Example 1, selection of indices corresponding to the application layer becomes easy. In addition, by introducing the statistical indices, it is possible to quickly determine the monitoring result of the process. Therefore, by introducing the index Sr represented by Expression (2), it is possible to accurately select a material suitable for manufacturing a product quickly and conveniently, and accurately by objective index rather than by visual observation of images and it is possible to quickly establish mass production process.

According to the present example, the same effect as that of Example 1 is obtained. In addition, it is possible to quickly determine the monitoring result of the process.

Example 3

An inspection device according to a third example of the present invention will be described. In this example, an example in which a problem of an etching process is found by evaluating a pattern after etching by using a new index will be described. The items described in Example 1 or 2 and not described in this example can also be applied to this example as long as there is no particular circumstance.

The inspection device to which the target wafer is input is the same as Example 1. In addition, the cross-sectional structure of the observation pattern is illustrated in FIG. 4(*b*).

Firstly, the wafer is input to the inspection device in the same procedure as that illustrated in FIG. 2C of Example 1, images the pattern, and extracts the pattern profile. The result is illustrated in FIG. 8. In terms of design, the pattern is an ellipse arranged at a pitch of 200 nm in both the x and y directions of the screen, and the major axis direction is the x direction. In addition, in terms of the design, the major axis is 120 nm and the minor axis is 80 nm. Four profile figures are obtained from one image. By approximating each profile by the ellipse, four approximate ellipses are obtained. The alignment of a center of gravity of the approximate ellipse is as designed, and is 200 nm. In addition, average major axis of the four approximate ellipses is 121.5 nm, and the average minor axis is 78.2 nm. The operator can be determined that it is close enough to the design value.

However, the angle θ formed by the major axis and the x direction of the lattice becomes zero in terms of design. However, it is a positive value, and θ of the four approximate ellipses becomes 4.5 degrees, 6.2 degrees, 10.0 degrees, and 2.1 degrees, respectively from the ellipse in the upper right of FIG. 8 in a counterclockwise manner.

Subsequently, the operator shifts the visual field of imaging in the right direction within the screen, images a pattern designed to have the same shape but different positions, repeats the calculation of θ, and obtains 100 pillar images totaling 25 points. Thereafter, the operator activates the program for analyzing the shape of the pillar in the same manner as in Example 1 and the image data is captured. As a result, the window illustrated in FIG. 9 appears. θ is selected as an index on this monitor screen, and folders of the 25 captured images are designated and analyzed.

As a result, the histogram shown in FIG. 10 is displayed. In the image analysis apparatus, the allowable range of the average value of θ and the lower limit value of the kurtosis of the distribution of θ are previously provided. The former is 0±5 degrees and the latter is −0.50. As a result of this analysis, since the average value of θ is 6.4 degrees, and this wafer is failed. The warning appears on the monitor screen. The kurtosis is 0.33, and it is not failed. However, since it is a positive value, it means that the distribution of θ is concentrated around the average value. That is, it is considered that there is a systematic cause of tilting the major axis of the ellipse.

Therefore, when the exposure apparatus and an etching apparatus are examined, slight deformation is observed in a gas supply nozzle of the etching apparatus, and it is found that the flow of the gas in a chamber became nonuniform, and repair is performed.

In the present example, it is possible to manage the systematic variation of the etching process appropriately and with high accuracy by statistically managing the angle θ in the major axis direction of the ellipse that is a comprehensible index. It is possible to detect abnormality early, which is unknown by the average values of θ and θ of simple individual patterns. By statistically managing indices and introducing Expressions (3) and (4), it is possible to detect the wafers which are not suitable for products at the stage of etching and rework the wafers. In addition, by detecting abnormality of the device quickly and processing the abnormality, it is possible to maintain the yield high for a long period of time.

According to the present embodiment, the same effect as that of Example 1 is obtained. In addition, the systematic variation in the processes can be appropriately managed.

Incidentally, the present invention is not limited to the above-described examples, and includes various modified examples. For example, the above examples are described in detail in order to explain the present invention for easy understanding, and the present invention is not necessarily limited to the structure that includes all, of the described components. Further, a part of a structure in one example can be replaced with a structure in another example, and a structure in one example can also be added to a structure in another example. Moreover, with respect to a part of a structure of each of the examples, another structure can be added, deleted and replaced.

REFERENCE SIGNS LIST

201: housing
202: electron gun
203: electron beam
204: lens
205: deflector
206: lens
207: sample
208: sample stage
209: secondary electron emitted from sample
210: detector
211: control system
212: terminal of inspection device
213: data storage device
240: image analysis apparatus
241 to 248: calculation unit
401: resist pattern
402: hardmask (silicon dioxide film)
403: metal electrode layer (film formed of electrode material)
404: magnetic material layer (film formed of magnetic material)
405: insulating layer (insulating material)
406: wiring pattern formed of metal material

The invention claimed is:

1. An inspection device comprising:
an image analysis apparatus that analyzes a top-down image signal of a sample which is output from a charged particle beam apparatus and has a plurality of columnar patterns or hole-shaped patterns formed at a regular interval, wherein the image analysis apparatus is configured to perform an edge calculation for an outline of an image obtained from the top-down image signal as a set of discrete points representing a position of an edge,
wherein the image analysis apparatus is further configured to perform
an approximation calculation that approximates the set of discrete points of the edge using an ellipse or a circle,
a distance calculation that calculates a distance between the approximated ellipse or the circle and each point of the edge,
an angle calculation that calculates a major axis, a minor axis, an eccentricity, and an angle formed by a major axis direction with an image horizontal axis direction of the approximated ellipse as a first index group, and
a Cr calculation that calculates a circumferential length of an outline of a columnar pattern or hole-shaped pattern on the sample and a value obtained by dividing a square of the circumferential length by a value obtained by multiplying an area surrounded by the outline of the columnar pattern and $4\pi$ as one of a second index group.

2. The inspection device according to claim 1, wherein the image analysis apparatus is further configured to perform an Sr calculation that calculates a first value obtained by dividing a second value, which is obtained by multiplying a standard deviation of a distribution of values of a distance between the set of the discrete points of the edge and the approximate ellipse or circle by 3, by an average radius of the approximate ellipse or a radius of the circle as another one of a second index group.

3. The inspection device according to claim 1, wherein the image analysis apparatus is further configured to perform a frequency distribution calculation that calculates
a frequency distribution of index values of the first and second index groups calculated on an image of a plurality of patterns obtained from a plurality of locations on the sample, and
a statistical index calculation that calculates an average value of the index values, a standard deviation of the distribution, skewness, and kurtosis from the calculated frequency distribution as a statistical index group.

4. The inspection device according to claim 3, further comprising:
a display that displays at least one of the statistical index groups.

5. The inspection device according to claim 3, further comprising:
wherein the image analysis apparatus is further configured to output a warning issuing a warning in a case where a calculated index value in the statistical index group deviates from an upper limit value or a lower limit value input in advance for at least one of the statistical index groups or both range of the upper limit value and the lower limit value.

6. The inspection device according to claim 3, further comprising:
a display that associates at least one index value among the first and second index groups with a position on the sample and in a case where it is determined that most abnormalities occur in the edge of the sample, and performs displaying so as to adjust conditions of an exposure apparatus.

7. An inspection device comprising:
a charged particle beam irradiation device that irradiates a sample with a charged particle beam;
a controller that controls the charged particle beam irradiation device;
an image analysis apparatus that analyzes an image obtained by using a secondary electron emitted from the sample by irradiation of the charged particle beam; and
a terminal that includes a display twit-connected to the controller and the image analysis apparatus,
wherein a plurality of columnar patterns or hole-shaped patterns are formed on a surface of the sample, and
wherein the image analysis apparatus is further configured to
select a first index among a diameter D and a radius R of an approximate circle for approximating a shape of one of the plurality of columnar patterns or hole-shaped patterns when subjected to a top-down observation by a circle, and a major axis a, a minor axis b, an angle $\theta$ formed by a major axis direction with an image horizontal axis direction, an eccentricity e, and an ellipticity f of an approximate ellipse for approximating a shape of said one columnar pattern or hole-shaped pattern with an ellipse, as the first index for analyzing said one columnar pattern or hole-shaped pattern, and
select a second index among Cr that is a first value obtained by dividing a square of a circumferential length of an outline of one of the plurality of columnar patterns or hole-shaped patterns obtained from the image by $4\pi$ and further dividing the first value by an area surrounded by the outline and Sr that is a second value obtained by dividing a third value, which is obtained by multiplying a standard deviation of a distribution of values of a distance between the approximate ellipse or the approximate circle and an edge of the outline by 3, by a radius of the approximate circle or an average radius of the approximate ellipse.

8. The inspection device according to claim 7,
wherein the image analysis apparatus is further configured to perform
   a frequency distribution calculation that calculates a frequency distribution of index values of the selected first and second indexes and which is calculated on an image of a plurality of the columnar patterns or hole-shaped patterns obtained from a plurality of locations on the sample, and
   a statistical index calculation that calculates at least one of an average value of the index values a standard deviation of the distribution, skewness, and kurtosis from the calculated frequency distribution as a statistical index.

9. An inspection device comprising:
a charged particle beam irradiation system that irradiates a sample with a charged particle beam;
a controller that controls the charged particle beam irradiation system;
an image analysis apparatus that analyzes an image obtained using a secondary electron emitted from the sample by irradiation of the charged particle beam; and
a terminal that includes a display connected to the controller and the image analysis apparatus,
wherein a plurality of columnar patterns or hole-shaped patterns are formed on a surface of the sample, and
wherein the display of the terminal provides a screen for selecting
   a diameter D and a radius R of an approximate circle for approximating a shape of one of the plurality of columnar patterns or hole-shaped patterns when subjected to a top-down observation by a circle, and a major axis a, a minor axis b, an angle θ formed by a major axis direction with an image horizontal axis, an eccentricity e, and an ellipticity f of an direction approximate ellipse for approximating a shape of said one columnar pattern or hole-shaped pattern with an ellipse, as a first index for analyzing the one columnar pattern or hole-shaped pattern, and
   Cr that is a first value obtained by dividing a square of a circumferential length of an outline of said one columnar pattern or hole-shaped pattern obtained from the image by 4π and further dividing the first value by an area surrounded by the outline and Sr that is a second value obtained by dividing a third value, which is obtained by multiplying a standard deviation of a distribution of values of a distance between the approximate ellipse or the approximate circle and an edge of the outline by 3, by a radius of the approximate circle or an average radius of the approximate ellipse, as a second index.

10. The inspection device according to claim 9,
wherein the display of the terminal displays at least one of a frequency distribution of a plurality of the first index and/or the second index corresponding to the plurality of columnar patterns or hole-shaped patterns, an average value of index values, a standard deviation of the distribution, skewness, and kurtosis.

\* \* \* \* \*

UNITED STATES PATENT AND TRADEMARK OFFICE
CERTIFICATE OF CORRECTION

PATENT NO. : 10,672,119 B2
APPLICATION NO. : 15/758630
DATED : June 2, 2020
INVENTOR(S) : Atsuko Yamaguchi et al.

Page 1 of 1

It is certified that error appears in the above-identified patent and that said Letters Patent is hereby corrected as shown below:

In the Claims

Claim 5, at Column 16, Line 20:
Please delete "a warning issuing".

Claim 7, at Column 16, Line 43:
Please delete "twit-".

Signed and Sealed this
Fifth Day of January, 2021

Andrei Iancu
*Director of the United States Patent and Trademark Office*